US012751252B2

(12) United States Patent
Chua et al.

(10) Patent No.: US 12,751,252 B2
(45) Date of Patent: Sep. 29, 2026

(54) OPTICALLY ACTIVATED OBJECT MASS TRANSFER USING MULTIPLE OPTICAL ENERGY SOURCES

(71) Applicant: Genesse Valley Innovations, LLC, Santa Clara, CA (US)

(72) Inventors: Christopher L. Chua, San Jose, CA (US); Ching-Fuh Lin, Palo Alto, CA (US); Zhihong Yang, Palo Alto, CA (US)

(73) Assignee: Genesee Valley Innovations, LLC, Santa Clara, CA (US)

( * ) Notice: Subject to any disclaimer, the term of this patent is extended or adjusted under 35 U.S.C. 154(b) by 1016 days.

(21) Appl. No.: 17/875,729

(22) Filed: Jul. 28, 2022

(65) Prior Publication Data

US 2024/0038574 A1 Feb. 1, 2024

(51) Int. Cl.
*H01L 21/687* (2006.01)
*H10P 72/30* (2026.01)
*H10P 72/76* (2026.01)

(52) U.S. Cl.
CPC ...... *H10P 72/7602* (2026.01); *H10P 72/3402* (2026.01); *H10P 72/3412* (2026.01)

(58) Field of Classification Search
CPC ......... H01L 21/68707; H01L 21/67766; H01L 21/67781; H10P 72/7602; H10P 72/3402; H10P 72/3412
See application file for complete search history.

(56) References Cited

U.S. PATENT DOCUMENTS

| | | | | |
|---|---|---|---|---|
| 7,195,687 | B2 | 3/2007 | Hayashi et al. | |
| 9,412,727 | B2 | 8/2016 | Menard et al. | |
| 9,496,155 | B2 | 11/2016 | Menard | |
| 10,964,582 | B2 | 3/2021 | Wang et al. | |
| 11,302,561 | B2 | 4/2022 | Wang et al. | |
| 2003/0022403 | A1 * | 1/2003 | Shimoda | H10D 84/90 257/E27.113 |
| 2005/0155699 | A1 | 7/2005 | Hayashi et al. | |
| 2013/0130440 | A1 | 5/2013 | Hu | |
| 2013/0210194 | A1 | 8/2013 | Bibl | |
| 2015/0344755 | A1 | 12/2015 | Schneider | |
| 2017/0215280 | A1 | 7/2017 | Chaji | |
| 2017/0358478 | A1 | 12/2017 | Thothandri et al. | |
| 2020/0402831 | A1 | 12/2020 | Wang | |
| 2024/0036364 | A1 | 2/2024 | Chua | |
| 2024/0038574 | A1 | 2/2024 | Chua | |

* cited by examiner

*Primary Examiner* — Ermias T Woldegeorgis
(74) *Attorney, Agent, or Firm* — Mueting Raasch Group

(57) ABSTRACT

A transfer system includes first and second optical energy sources operable to provide a respective first and second optical energy at respective first and second wavelengths. A chiplet has a bonding feature configured to interface with a corresponding bonding feature of a target substrate. At least one of the bonding features absorb at the first wavelength such that applying the first optical energy bonds the chiplet to the target substrate or removes a bond between the chiplet and the target substrate. The system includes a transfer layer formed of a thermally switchable material that undergoes a phase change when heated. An optical absorber absorbs at the second wavelength such that applying the second optical energy heats a region of the transfer layer at a location of the chiplet when removing the chiplets from a source substrate during the transfer operation.

9 Claims, 11 Drawing Sheets

OPTICALLY ACTIVATED OBJECT MASS TRANSFER USING MULTIPLE OPTICAL ENERGY SOURCES

SUMMARY

The present disclosure is directed to transfer layer with optically-activated, repeatable, and reversible rigid-to-soft transitions to facilitate object (e.g., chiplet) mass transfer. In one embodiment, a transfer system includes first and second optical energy sources operable to provide a respective first optical energy and second optical energy at a respective first wavelength and a second wavelength. The system includes a chiplet having a bonding feature configured to interface with a corresponding bonding feature of a target substrate. At least one of the bonding feature and the corresponding bonding feature absorb at the first wavelength such that applying the first optical energy bonds the chiplet to the target substrate or removes a bond between the chiplet and the target substrate. The system includes a transfer layer formed of a thermally switchable material that undergoes a phase change when heated, the transfer layer being placed in contact with the chiplet during a transfer operation. An optical absorber material is on at least one of the transfer layer and the chiplet. The optical absorber material absorbs at the second wavelength such that applying the second optical energy heats a region of the transfer layer that corresponds to a location of the chiplet when removing the chiplets from a source substrate during the transfer operation. The transfer layer is reusable for repeated transfer operations.

In another embodiment, a method involves causing a transfer layer of a transfer head to selectively remove a chiplet from a source substrate or surface and place the chiplet on a target substrate or surface such that a bonding feature is between the chiplet and the target substrate or surface. First optical energy is applied at a first wavelength through the transfer layer and the chiplet to heat the bonding feature and thereby bond the chiplet to the target substrate or surface. Second optical energy is applied at a second wavelength to heat an optical absorber material proximate a region of the transfer layer that is in contact with the chiplet. The transfer layer is formed of a thermally switchable material such that the region exhibits a phase change in response to being heated. After the chiplet has bonded and while the region is heated, the method involves moving the transfer head relative to the target substrate or surface to release the chiplet, wherein the transfer layer is reusable for repeated transfer operations.

In another embodiment, a method involves applying thermal energy to a first chiplet that is mounted to a target substrate or surface thereby removing a bond between the first chiplet and the target substrate or surface. The first chiplet is removed from the target substrate or surface by physically pushing the first chiplet out of its bonded position and vacuuming the first chiplet away from the target substrate or surface. A transfer layer of a transfer head to selectively removes a second chiplet from a source substrate or surface and places the second chiplet on the bonded position of the first chiplet on the target substrate or surface such that a bonding feature is between the second chiplet and the target substrate or surface. First optical energy is applied at a first wavelength through the transfer layer and the second chiplet to heat the bonding feature and thereby bond the second chiplet to the target substrate or surface. Second optical energy is applied at a second wavelength to heat an optical absorber material proximate a region of the transfer layer that is in contact with the second chiplet. The transfer layer is formed of a thermally switchable material such that the region exhibits a phase change in response to being heated. After the second chiplet has bonded and while the region is heated, the transfer head is moved relative to the target substrate or surface to release the second chiplet.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures. The drawings are not necessarily to scale.

DETAILED DESCRIPTION

Figure 2:
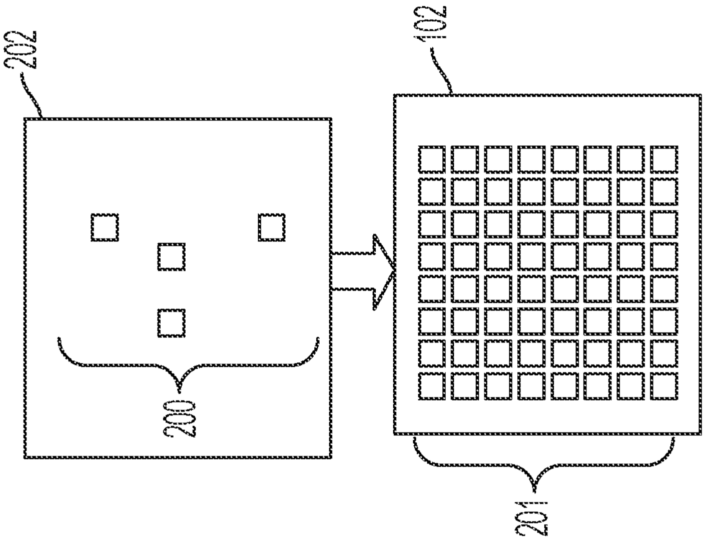
FIGS. 1 and 2 are block diagrams showing an assembly process according to an example embodiment.

The present disclosure relates to manipulation and assembly of objects, and in some embodiments the mass assembly of micro-objects via a transfer substrate. Some electronic devices are fabricated by mechanically overlaying small objects on top of each other. While micro-electronic and micro-optical components are sometimes manufactured using wafer formation techniques such as layer deposition, masking, and etching, certain classes of materials are not growth-compatible with each other. In such a case, the assembly may involve forming one class of devices on a first substrate and a second class of devices on a second substrate, and then mechanically joining them, e.g., via flip-chip or transfer printing techniques.

Aspects described herein relate to a system that is capable of transferring large number of micro objects (e.g., particles, chiplets, mini/micro-LED dies) from a donor substrate to another substrate in parallel while maintaining high position registration of the individual micro objects. This system allows selectively transferring of micro objects from a donor substrate and selectively placing the micro objects to the destination or target substrate. This system may be used for assembling devices such as microLED displays.

Generally, microLED displays are made with arrays of microscopic LEDs forming the individual transfer elements. Both OLED displays and microLED displays offer greatly reduced energy requirements compared to conventional LCD systems. Unlike OLED, microLED is based on conventional LED technology, which offers higher total brightness than OLED produces, as well as higher efficiency in terms of light emitted per unit of power. It also does not suffer from the shorter lifetimes or slower temporal response of OLED.

A single 4K television utilizing microLED has ~25 million small LED subpixels that need to be assembled. Mass transfer of chiplets is one technology that may be used for microLED manufacturing. Transferring microLED to a target backplane quickly and accurately with a high yield will be one of the techniques that manufacturers need to perfect in order for microLED to be a viable mass-market product.

The techniques described below can be used for microLED manufacture, as well as other assembly procedures in which a large number of (typically) small objects need to be moved at once, and where it may be necessary to selectively move a subset of such device to and/or from the transfer media. Such micro objects may include but not limited to inks, pre-deposited metal films, silicon chips, integrated circuit chips, beads, microLED dies, lasers, waveguides, photonic components, micro-electro-mechanical system (MEMS) structures, and any other pre-fabricated microstructures. In the present disclosure, these objects may be collectively referred to as "chiplets" in that they are small, individually separable devices or structures amenable to selective mass-transfer from a source to a target.

Being able to selectively transfer chiplets in an arbitrary pattern is useful to facilitate the effective transfer process, pixel repair, hole/vacancy refill for microLED display manufacturing, which will lead to high process yield. An elastomer stamp has been used to deterministically transfer microscale LED chips for this type of application. However, an elastomer stamp has fixed pattern and cannot transfer arbitrary pattern of chiplets. Inevitably, some subset of the chiplets will be defective, and therefore it becomes difficult to replace a select few of them using such a stamp.

Figure 1:
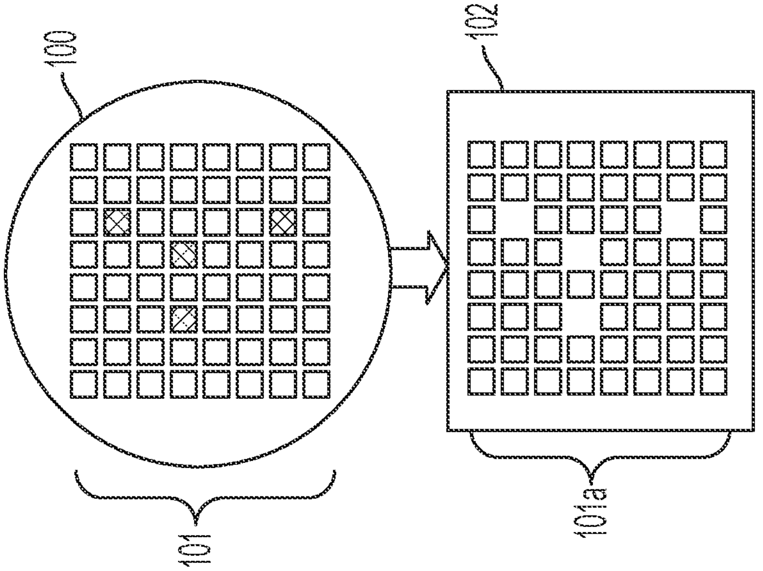

In FIGS. 1 and 2, block diagrams show an example of an assembly process that can be achieved using devices, systems, and methods according to example embodiments. In FIG. 1, a donor wafer/substrate 100 is shown that includes an array of chiplets 101 that may have been grown or placed on the substrate or surface 100. The shaded chiplets in the array 101 have been identified as defective, and when the chiplets are transferred to a target substrate 102, only a subset 101*a* of the chiplet array are transferred, namely the good chiplets that are not shaded. This may be achieved with a transfer head 202 as shown in FIG. 2 that can selectively pick up just the subset 101*a* from the donor substrate 100 once they are identified. As shown in FIG. 2, the transfer head 202 can subsequently pick up a second set of chiplets 200 (e.g., from a different donor substrate). The locations of the chiplets within the set 200 correspond to the locations of the defective chiplets on the first donor substrate 100. The transfer head 202 moves this set 200 to the target substrate 102, resulting in a full set 201 of operational chiplets being located on the target substrate 102.

The present disclosure relates to, among other things, a transfer head with a transfer layer that can be activated at predetermined locations to selectively hold and transfer an array of micro objects on a substrate, or subset thereof. In the latter case, even when the whole transfer layer is in contact with the array of micro objects, only the subset will adhere to the transfer head and be transferred, and the objects outside the subset will be left behind or otherwise unaffected. Similarly, the transfer layer may be able to selectively release a subset of micro objects that are currently attached to the transfer layer, such that only the part of the held objects are released. The transfer layer may non-selectively release the subset as well, e.g., release all chiplets currently held regardless of position. The activation process is repeatable and reversible, such that no permanent bonding or sacrificial material is needed to affect the selective holding or releasing of the objects.

In FIGS. 3, 4, 5, and 6, side views illustrate details of a transfer head 302 used in a system 300 according to an example embodiment. The transfer head 302 includes a transfer layer 304 formed on a base structure or substrate 306. Portions of the transfer layer 304 can selectively be made to change stiffness via the application and removal of heat to a localized region. The change in mechanical properties of the transfer layer 304 may also be referred to herein as a phase change, e.g., from a solid state to a gelatinous/liquid state.

For example, the stiffness can be expressed as the Young's modulus of the material from which the transfer layer 304 is made. The Young's modulus is a measure of stress (force per unit area) divided by strain (proportional deformation) in a material in the linear elasticity regime. Generally, materials with higher Young's modulus (lower strain for a stress a) are stiffer than a material with lower Young's modules (higher strain for the same a). Other measures may also be used to represent stiffness of a material, such as storage modulus, which also accounts for dynamic performance of the material. Some measures may be used to represent stiffness of a part, such as a spring constant, that may be functionally equivalent in defining performance of the part. However the stiffness is described, the transfer layer 304 can experience a change in stiffness in response to temperature that can be utilized in device transfer as described below.

The transfer layer 304 has a higher Young's modulus (e.g., >6 MPa) at a lower temperature and a lower Young's modulus (e.g., <1 MPa) at a higher temperature. An optical energy source 308 (e.g., one or more lasers) operable to change a temperature of the regions of the transfer layer in response to an input from a controller 312. In this case, the optical energy source is coupled to heat portions 304*a*, 304*b* of the transfer layer 304 (the heating indicated by shading), while portions 304*c* and 304*d* are not heated. This example illustrates how the transfer layer 304 can selectively pick up a subset of objects 310*a*, 310*b* from a source substrate 316 while leaving a second subset of objects 310*c*, 310*d* attached to the source substrate 316.

Figure 4:
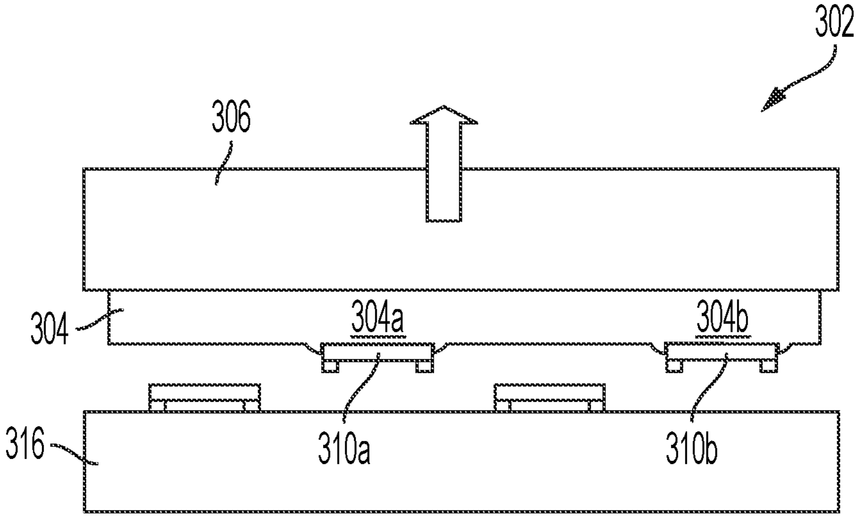

The heated portions 304*a*, 304*b* can deform around the objects 310*a*, 310*b* during the heating, and when the optical energy is removed, then the portions 304*a*, 304*b* re-solidify holding on the objects 310*a*, 310*b*. When the transfer head 302 is moved away from the source substrate 316 as shown in FIG. 4, objects 310*a*, 310*b* will be pulled from the source substrate 316 while objects 310*c*, 310*d* remain on the source substrate 316. When the transfer head 302 is moved over and in contact with a target substrate/backplane (see FIGS. 5 and 6), the portions 304*a*, 304*b* are reheated either via the optical energy source 308 or a different energy source allowing the objects 310*a*, 310*b* to be released onto the target substrate, which may have means for holding, adhering to, or attracting the objects 310*a*, 310*b* to ensure separation from the transfer head 302. Note that in the release phase, the entire transfer layer 304 may be heated and not just portions 304*a*, 304*b*, assuming that all currently attached chiplets are to be released. In some embodiments, no heating of transfer layer 304 is required if the adhesion force on the target substrate (e.g., solder) is sufficient to overcome the unheated holding force of 304*a* and 304*b*.

The apparatus 300 may be part of a micro-transfer system, which is a system used to transfer micro-objects (e.g., 1 μm to 1 mm) from the source substrate 316 to a target substrate. The transfer layer 304 may be formed of a multi-polymer that contains stearyl acrylate. In such a case, a difference between the higher and lower temperatures may be less than 20° C. (or in other cases less than 50° C.) in order to adjust the tackiness of the transfer layer 304 such that there is a marked difference in Young's modulus, e.g., from <1 MPa at the higher temperature to >6 MPa at the lower temperature. The controller 312 in such as a system may be coupled to actuators (not shown) that induce relative motion between the transfer head 302 and substrates to facilitate object transfer as described herein.

Generally, the transfer layer 304 forms an intermediate transfer surface whose compliance can be modulated (e.g., have a sharp rigid-to-soft transition) as a function of temperature. Such a surface can be used to pick up and release groups of micro-objects in a controlled and selectable manner. The optical energy source 308 may be optically coupled to mirrors, lenses, waveguides, and the like to selectively create hotspots on the transfer layer 304. The controller 312 can switch the optical energy source 308 off and on so that only selected regions are heated. The hotspots may have diameter D from sub-micrometers to several hundreds of micrometers and may be adjustable via optics and power inputs to the optical energy source 308. The pitch of the hotspots may vary from sub-micrometers to several millimeters. The base structure 306 may be formed of a transparent material at the wavelengths used by the optical energy source 308, such as glass, quartz, silicon, polymer and silicon carbide (SiC). The base structure 306 may have a thickness that ranges from several tens of microns to several millimeters and lateral dimensions from several millimeters to one meter.

Phase-changing polymer comprising stearyl acrylate (SA) has been studied as a bistable electroactive polymer (BSEP) for use in the transfer layer. The BSEP polymer is a rigid polymer below its glass transition temperature (Tg). Above Tg, it becomes an elastomer that exhibits large elongation at break and high dielectric field strength. Electrical actuation can be carried out above Tg with the rubbery BSEP functioning as a dielectric elastomer. The deformation is locked when cooling down the polymer below Tg. The shape change can be reversed when the polymer is reheated above Tg.

Stearyl acrylate (octadecyl acrylate, SA) based polymers have been investigated as shape memory polymers due to their sharp phase transition between the crystalline and molten states of the stearyl moieties. The abrupt and reversible phase transition of the crystalline aggregates of the stearyl moieties results in a rapid shift between the rigid and rubbery states of the polymers during temperature cycles. The transition of SA is typically below 50° C. with a narrow phase change temperature range of less than 20° C. Therefore, SA is an ideal component for imparting a sharp rigid-to-rubbery transition.

The transfer layer 304 may be made of materials including but not limited to stearyl acrylate (octadecyl acrylate, SA) based polymers, stearyl acrylate and urethane diacrylate copolymer or other types of polymers. In particular, a copolymer containing urethane diacrylate and SA has been found to have desirable characteristics for these purposes. The transfer layer 304 preferably has a sharp rigid-to-soft transition therefore the adhesion can be easily modulated with temperature change.

The transfer layer materials described above are transparent at laser wavelengths commonly used in mass assembly systems, e.g., green and blue lasers. Thus, when using lasers of these wavelengths, the transfer layer 304 may not be directly heat-able by the optical energy source 308 but can instead be heated by an optical absorber that is built into the transfer head or applied to some or all of the chiplets 310*a-d*. Further, the optical energy source 308 may be able to bond the chiplets 310*a-b* to a target substrate during assembly and/or unbond the chiplets 310*a-b* after installation, e.g., to affect a repair. This bond heating can be performed simultaneously with or in series with heating the transfer layer 304, allowing assembly or disassembly in a single operation using the transfer head.

Figure 5:
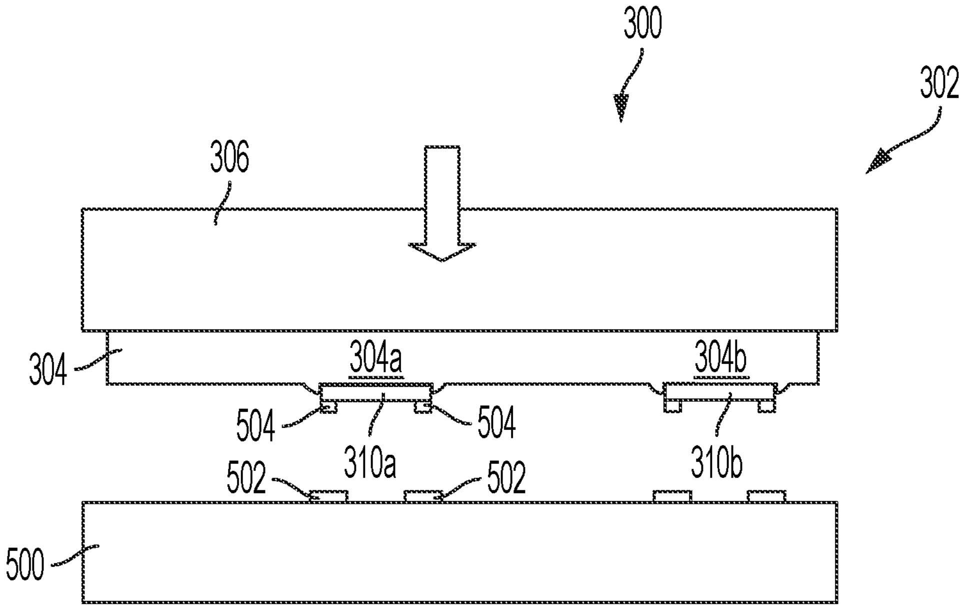

In FIG. 5, the transfer head 302 is shown positioned over a target substrate 500 onto which the chiplets 310*a-b* are to be attached. The chiplets 310*a-b* have bonding features 504 that interface with corresponding bonding features 502 on the target substrate 500. The bonding features 502, 504 provide one or both of mechanical and electrical bonding between the target substrate 500 and chiplets 310*a-b*. Relative motion is induced between the transfer head 302 and the target substrate 500 until the chiplets 310*a-b* are contacting the corresponding bonding features 502 as seen in FIG. 6.

Figure 6:
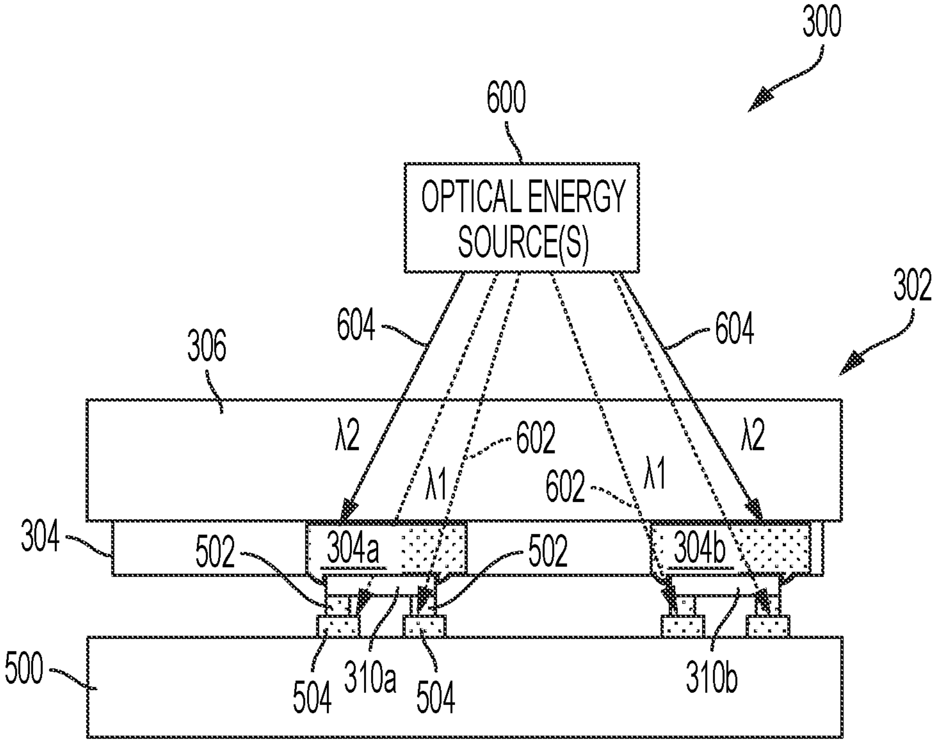

In FIG. 6, one or more optical energy sources 600 are shown that are used to both bond the chiplets 310*a-b* to the target substrate 500 and release the chiplets 310*a-b* from the transfer layer. Note that the optical energy source 308 in FIG. 3 could be part of the optical energy sources 600. Generally, the optical energy sources 600 may include at least two sources (e.g., lasers) that emit at different wavelengths that are selected for heating the transfer layer 304 and the bonding features 502, 504.

As shown in FIG. 6, a first optical energy 602 is emitted from the optical energy source 600 at a first wavelength λ1. The chiplets 310*a-b* are transparent at this first wavelength λ1, such that the first optical energy 602 is absorbed by one or both of the bonding features 502, 504, causing them to melt, fuse, etc. When the first optical energy 602 has been applied for a sufficient time, it is removed allowing the bonding features 502, 504 to cool.

In some embodiments, the bonding of the chiplets 310*a-b* to the target substrate 500 can sufficient secure the chiplets 310*a-b* to the substrate 500 such that the chiplets 310*a-b* will not be removed if the transfer head 302 is pulled away. However, because the regions 304*a-b* may still be conforming to the chiplets 310*a-b*, pulling the transfer head 302 away with the transfer layer 304 still holding the chiplets 310*a-b* could risk damaging the transfer layer 304. Therefore, it is desirable that at least regions 304*a-b* are heated before pulling the transfer head 302 away. In some embodiments, the residual heat from bonding the chiplets 304*a-b* may also soften the transfer layer 304 such that there may be a time period after first optical energy 602 is removed that the bonding features 502, 504 have cooled enough to be fully adhered, while regions 304*a-b* of the transfer layer 304 are still warm enough to be softened. Thus, the transfer head 302 might be moved away from the target substrate 500 (or vice versa) in this time period without risk of damage to the transfer layer 304.

In other embodiments, the transfer layer 304 could be reheated after bonding of the chiplets 310*a-b* by the optical energy sources 600 using a second optical energy 604 at a second wavelength λ2. Note that λ2 may be the same wavelength shown being emitted in FIG. 3. The heating of the transfer layer 304 at the stage shown in FIG. 6, need not be selective, such that the entire exposed region of the transfer layer 304 can be heated by the optical energy sources 600. Also, another heat source can be used for non-selective heating at this stage, such as laser irradiation, optical exposure, infrared lamp heating, electrical joule heating, inductive heating, radio-frequency (RF) heating, hot plate heating, conductive heating, convection heating, forced air, or a combination of different means.

The transfer layer 304 may be transparent at both the first wavelength λ1 and the second wavelength λ2. Thus, an optical absorber material can be integrated into the transfer head 302 or the chiplets 310*a-b* to facilitate heating the transfer layer using the second optical energy 604 at the second wavelength λ2, and this optical absorber may still be transparent at the first wavelength λ1. In one or more embodiments, an optical absorber layer (e.g., patterned or unpatterned) can be thermally coupled to a side of the transfer layer 304 facing away from the chiplets 310*a-b*, and this absorber layer heats the regions 304*a-b* when illuminated by the energy sources 308, 600. In other embodiments, an optically absorbing material can be mixed in with the thermally switchable material of the transfer layer 304. These embodiments are more fully described in commonly owned U.S. patent application Ser. No. 17/875620 filed on even date herewith, which is incorporated by reference.

Figure 3:
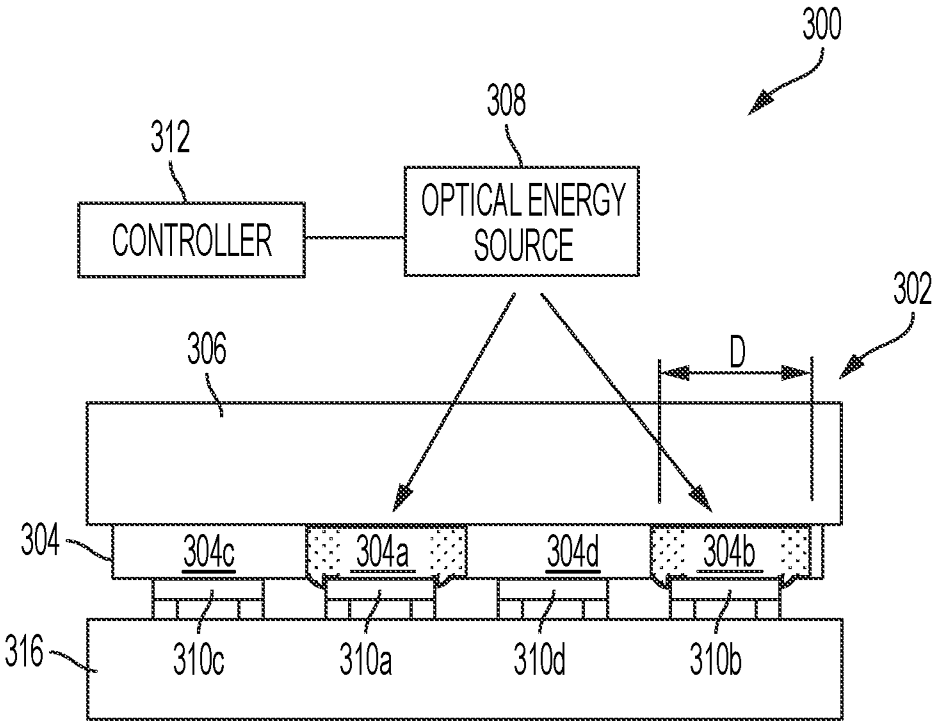
FIGS. 3, 4, 5 and 6 are views of showing a transfer system performing a transfer operation according to an example embodiment.

In one or more other embodiments, an optical absorber material can be applied to inward facing and/or outward facing sides of the chiplets 310*a-b*. The optical absorber material may be selectively applied to chiplets 310*a-b* while be omitted from chiplets 310*c-d*, such that selective application of optical energy is not needed to heat regions 304*a-b* without heating regions 304*c-d* as shown in FIG. 3. In other embodiments, the optical absorber material is non-selectively applied to or integrated with chiplets 310*a-d*, such that selective application of optical energy is used to heat regions 304*a-b* as shown in FIG. 3 without heating regions 304*c-d*. These embodiments are more fully described in commonly owned U.S. patent application Ser. No. 17,875620 filed on even date herewith, which is incorporated by reference.

Figure 7:
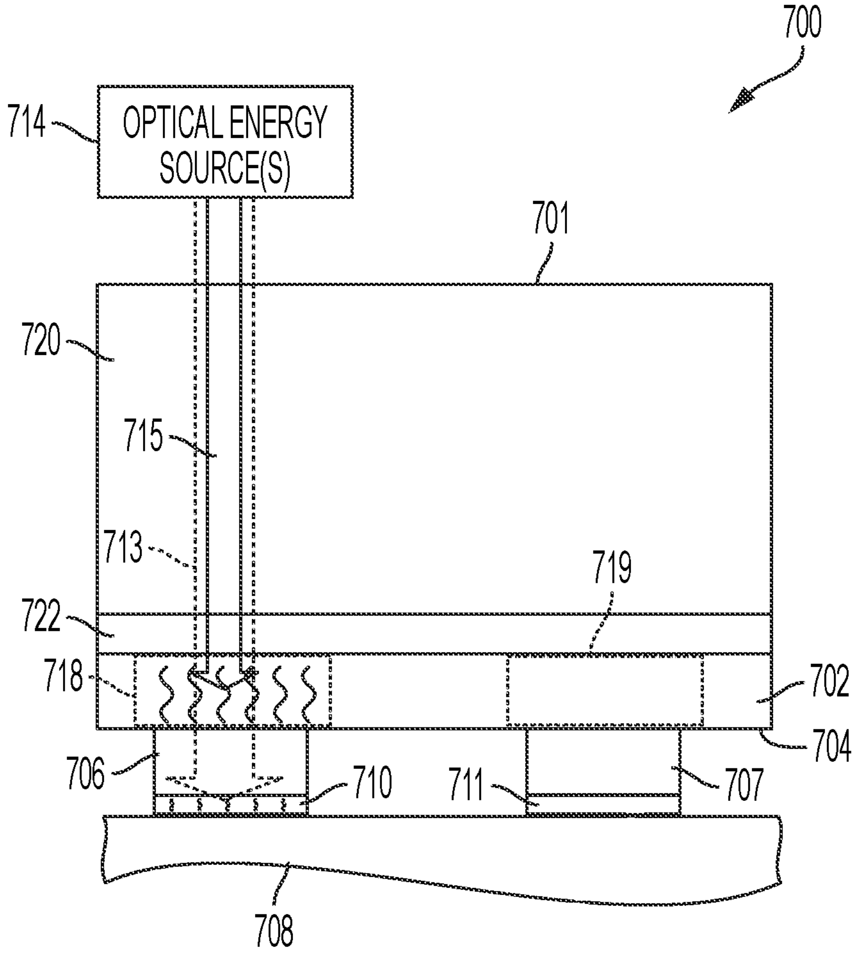
FIG. 7 is a side view showing a transfer system according to an example embodiment.

In FIG. 7, a diagram shows features of a system 700 according to one or more embodiments. The system 700 includes a transfer head 701 with a transfer layer 702 formed of a thermally switchable material that undergoes a phase change when heated. A side 704 of the transfer layer 702 is placed in contact with chiplets 706, 707 during a transfer operation. The transfer operation may include, for example, selectively removing the chiplets 706, 707 from a source substrate or surface (not shown; also referred to herein as a donor substrate or surface), moving the chiplets 706. 707 to a target substrate or surface 708, and releasing the chiplets 706, 707 onto the target substrate or surface 708. The chiplets 706, 707 can be any microscale object. A large number of such objects are typically arrayed on the source substrate or surface.

An optical absorber material (not shown) is proximate the chiplets 706, 707 and/or the transfer layer 702, according to any configurations described above. One or more optical energy sources 714 are operable to apply first and second optical energy 713, 715 (e.g., scanned laser beams) to the transfer head 701. During the removal of the chiplets 706, 707 from the source substrate or surface, the second optical energy 715 selectively heats the transfer layer 702 (via the optical absorber material) at regions 718, 719 which correspond to location of the chiplets 706, 707. The regions 718, 719 hold the chiplet when the optical energy 715 is removed during the this first part of the transfer operation, e.g., after a phase change in region 718 has caused the switchable material to conform to and grip the chiplets 706, 707. The transfer layer 702 is held and supported by a base structure such as a substrate 720. The substrate 720 may be transparent at the wavelength of the optical energy 713, 715, or may have other features (e.g., voids) that allow the optical energy 715 to pass to the optical absorber material.

Removal of the optical energy 715 causes the switchable material to harden in while gripping the chiplets 706, 707, such that when the transfer head 701 is pulled away from the source substrate or surface, the chiplets 706, 707 are removed. After removal of the targeted chiplets 706, 707 from the source substrate or surface, the transfer head 701 can then be moved to the target substrate or surface 708 where the chiplets 706, 707 are placed. This placement onto the target substrate or surface 708 is shown in FIG. 7.

As seen in FIG. 7, bonding features 710, 711 are located between the chiplets 706, 707 and the target substrate or surface 708. The bonding features 710, 711 are formed of a material that can electrically and/or mechanically bond the chiplets 706, 707 when sufficiently heated and cooled. The bonding features 710, 711 may be formed on the chiplets 706, 707, on the target substrate or surface 708, and/or be an intermediate object (e.g., solder paste/ball, droplet of resin) placed between chiplets 706, 707 and substrate/surface 708.

The chiplets 706, 707 are transparent to the first optical energy 713, such that when the first optical energy 713 is applied, it is absorbed by the bonding features 710, 711. This causes melting, adhesion, welding, fusing, etc., of the bonding features 710, 711 causing the chiplets 706, 707, to bond to the target substrate or surface 708. After cooling of the bonding features 710, 711, the associated regions 718, 719 can be subsequently heated via the optical absorber material or by some other means to release the chiplets 706, 707 from the transfer head 701. The selectable holding and releasing of the chiplet 706 by the transfer layer 702 can be repeated for multiple chiplets during multiple operations. It is frequently desirable to perform a thermal cycle between transfer operations to recondition the transfer layer 702 and to smooth out surface features formed on transfer layer 702 during the previous operation. This involves, for example, heating and cooling the transfer layer above and below Tg one or more times while no objects are attached to the transfer layer.

Note that when releasing the chiplets 706, 707 from the transfer head 701, selective heating of the transfer layer 702 may not be needed since all chiplets currently on the transfer head 701 may be released at once. In such case, the entire transfer layer may be heated, e.g., via non-selective application of the optical energy or alternate means. The selective or non-selective subsequent means for releasing chiplets include laser irradiation, optical exposure, infrared lamp heating, electrical joule heating, inductive heating, RF heating, hot plate heating, conductive heating, convection heating, forced air, or a combination of different means. In some embodiment where the counterforce from bonding features 710, 711 is stronger than the unheated holding force of 718, 719, subsequent heating of regions 718 and 719 may not be performed during the chiplet release step.

The system 700 can also be used to remove an installed chiplet, e.g., to remove a failed chiplet 706 that was previously bonded to the target substrate or surface 708. In such a case, transfer head 701 is moved to contact the chiplet 706, after which the second optical energy 715 can be applied to cause the region 718 region to conform and hold the chiplet 706. In this case, if chiplet 707 is not to be removed for example, region 719 would not be heated. After the region 718 cools, the first optical energy 713 can be applied to soften or melt the bonding feature 710. When the bonding feature 710 has been heated sufficiently for separation (e.g., bonding forces have been reduced or removed), one or both of the transfer head 701 and target substrate or surface 708 are moved away from each other, and the chiplet 706 is then pulled away from the target substrate or surface 708.

In other embodiments, the chiplet 706 can be removed by a mechanism different than the transfer head 701. For example, the chiplet 706 can be selectively heated (e.g., via a laser) and physically dislodged (e.g., using a probe or vacuum) to loosen or break the bond that holds the chiplet to the target substrate or surface 708. The chiplet 706 can then be removed (e.g., via a vacuum) leaving the bonding position open for installing a second chiplet (not shown) which can be transferred from a source substrate and attached to the target substrate or surface 708 as described above.

Generally, the system 700 shown in FIG. 7 may include a dual-wavelength transfer system, where optical energy at one of the wavelengths is used for activating the switchable material for pick and place and optical energy at another wavelength (e.g., a longer wavelength) is used for performing in-situ welding/soldering that forms electrical interconnects or melting/desoldering that removes mechanical bonds. In one or more embodiments, the longer wavelength light passes through the device being placed, reaches the metal contacts of the chiplets 706, 707, and heats the contacts on the chiplets 706, 707 and/or corresponding pads on a backplane.

In one or more embodiments, the transfer head 701 utilizes a long pass color filter 722 as the absorber material. In one embodiment, the transfer layer 702 may have wavelength selective, optically absorbing materials mixed in, such that the transfer layer 702 also acts as the color filter 722. The optically absorbing material can be wavelength selective or can be designed to have band-pass properties that is absorbing across certain wavelength ranges and transparent to light at other wavelength ranges. In other embodiments, the color filter 722 can be a semiconductor optical absorber layer that is absorbing to light at wavelengths above the bandgap energy and transparent to light at wavelengths below the bandgap energy. In other embodiments, a color filtering absorber material may be applied to an outward facing surface of the chiplets 706, 707.

Figure 8:
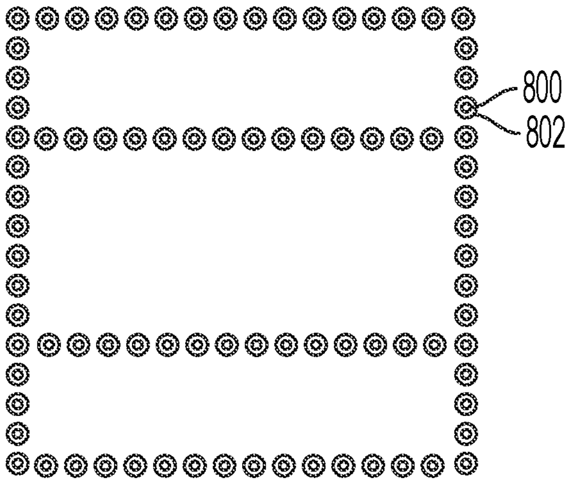
FIG. 8 is a diagram showing an exposure pattern formed by a dual laser optical scanner according to an example embodiment.

A shorter wavelength laser light 715, e.g., 445 nm, can be absorbed in the color filter 722 and is used for generating heat that selectively activates the transfer layer material. A second overlapping longer wavelength laser light 713, e.g., 1065 nm, passes through the filter 722, through the transfer layer 702, and through the chiplets 706, to then reach metal contact pads or other parts of the bonding features 710, 711. In FIG. 8, a diagram shows an example exposure pattern formed by scanning two overlapping laser beams of different wavelengths, for example, one blue (405 nm) and one IR (1065 nm). The hotspots 800, 802 formed by the different wavelengths are shown in the diagrams as having different diameters to aid in visualization, however the diameters of the hotspots 800, 802 may be roughly the same size.

Figure 9:
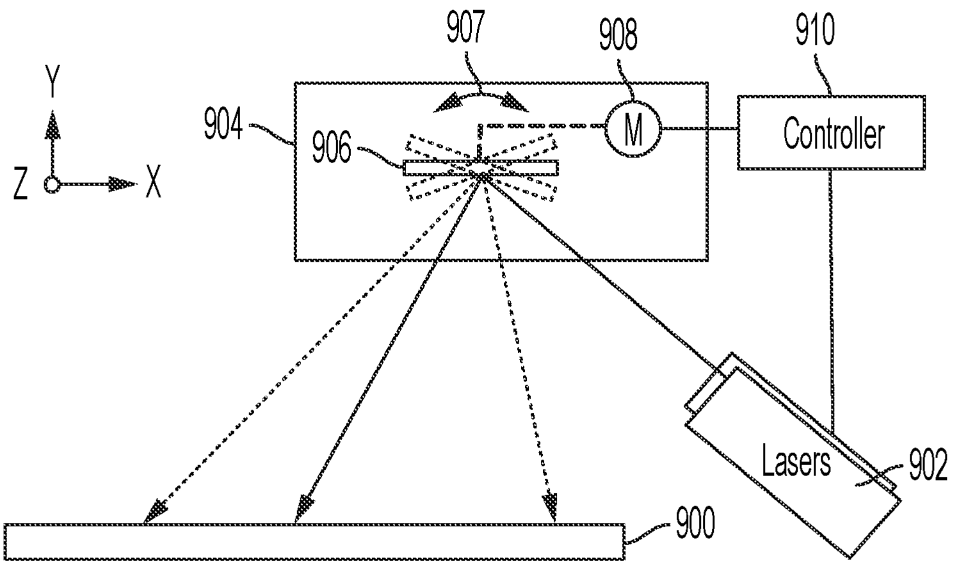
FIG. 9 is a diagram of an optical scanner used for selective heating of a transfer head according to example embodiments.

In FIG. 9, a block diagram shows an example configuration of a heating subsystem that uses an optical scanner according to one or more embodiments. In this figure, a transfer layer 900 is part of a transfer head (not shown) as described elsewhere. An optical absorber layer may also be used with the transfer layer 900 but is omitted here for purposes of clarity. One or more optical energy sources (e.g., lasers 902) and scanning optics 904 may be integrated with the transfer head or located externally to the transfer head. In this example, the scanning optics 904 includes at least one or more movable mirrors 906 and one or more motors 908. Other components may be included in the scanning optics, such as lenses, polarizers, collimators, etc.

The movable mirror 906 is shown rotating as indicated by the arrow 907. A single axis rotation such as the illustrated z-axis rotation can facilitate scanning along a single row of a rectangular matrix of chiplets located below the transfer layer 900. The mirror 906 and motor 908 can also be configured to rotate about a second axis, e.g., the z-axis, to scan an adjacent row. A second mirror and motor (not shown) may also be used to affect a change in rows. In other embodiments, the mirror 906 and motor 908 could be configured to rotate about the y-axis, thereby resulting in a polar coordinate pattern being illuminated. Translations of mirrors may also be used instead of or in addition to the rotations described above.

One or more controllers 910 are coupled to the one or more motors 908 and facilitates precise movement of the mirror 906, e.g., via servo control. The controller(s) 910 also control output of the lasers 902, such that a spot on the transfer layer 900 is illuminated or not-illuminated based on whether heating is desired at a current location at which the laser beam is aimed. This can be achieved by turning the lasers 902 off and on, activating a shutter that blocks or redirects light emitted from the laser, etc.

The configuration shown in FIG. 9 can be extended to use more than one laser and/or optical scanner. Where there is significant difference between first and second wavelengths used for bonding and transfer layer heating, two different lasers 902 may be used, e.g., a first laser that emits at a first wavelength and a second laser that emits at a second wavelength. The first and second lasers 902 and the scanning optics can provide first and second scanned laser beams that provide overlapping coverage of the transfer head, e.g., as shown in FIG. 8. The optics may be calibrated separately for each laser 902, e.g., if they are mounted close to one another such that small changes to the positioning of the mirror 906 can compensate for the physical offset between lasers 902. In other embodiments, the lasers 902 may be switched in and out of a common optics pathway, e.g., via second mirror (not shown).

Figure 10:
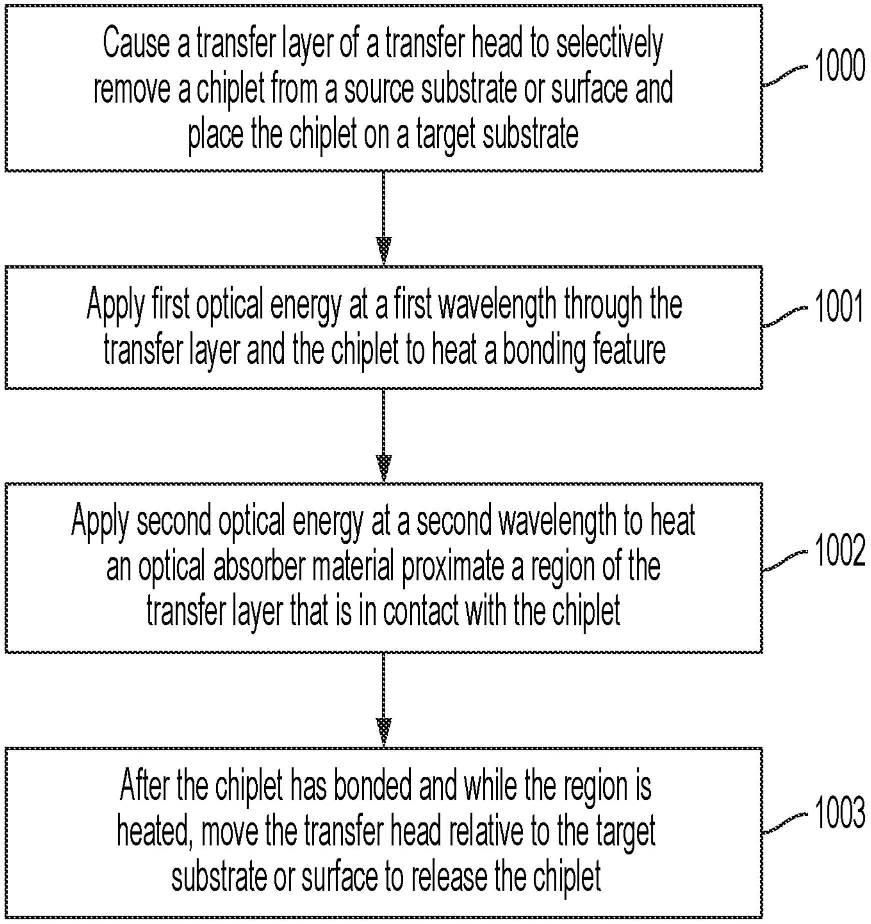
FIGS. 10, 11, and 12 are flowcharts of methods according to example embodiments

In FIG. 10, a flowchart shows a method of assembling a chiplet to a device according to an example embodiment. The method involves causing 1000 a transfer layer of a transfer head to selectively remove a chiplet from a source substrate or surface and place the chiplet on a target substrate or surface such that a bonding feature is between the chiplet and the target substrate or surface. First optical energy at a first wavelength is applied 1001 through the transfer layer and the chiplet to heat the bonding feature and thereby bond the chiplet to the target substrate or surface. Second optical energy at a second wavelength is applied 1002 to heat an optical absorber material proximate a region of the transfer layer that is in contact with the chiplet. The transfer layer is formed of a thermally switchable material such that the region exhibits a phase change in response to being heated. After the chiplet has bonded and while the region is heated, the transfer head is moved 1003 relative to the target substrate or surface to release the chiplet. This relative motion may be induced by moving one or both of the transfer head and the target substrate. The transfer layer is reusable for repeated transfer operations such as this. In alternative embodiments, step 1002 is not implemented and the transfer layer is not heated in step 1003.

Figure 11:
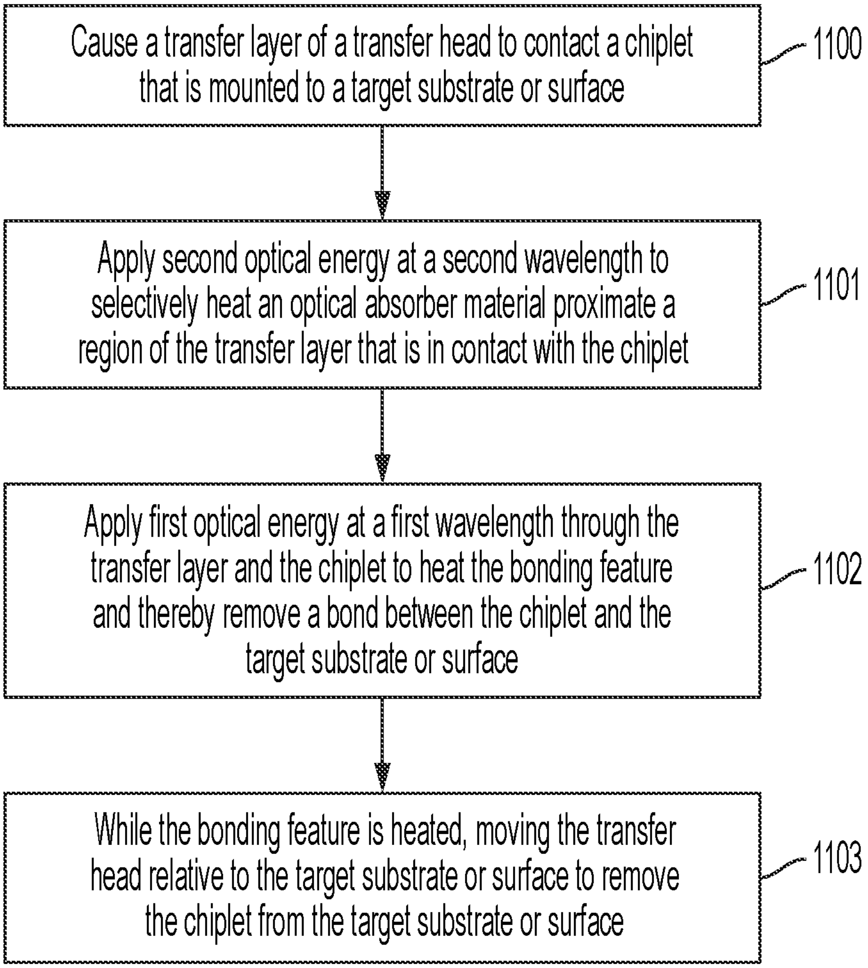

In FIG. 11, a flowchart shows a method of disassembling a chiplet from a device according to an example embodiment. The method involves causing 1100 a transfer layer of a transfer head to contact a chiplet that is mounted to a target substrate or surface. Second optical energy is applied 1101 at a second wavelength to selectively heat an optical absorber material proximate a region of the transfer layer that is in contact with the chiplet. The transfer layer is formed of a thermally switchable material that undergoes a phase change when heated resulting in the region of the transfer layer conforming to the chiplet. First optical energy is applied 1102 at a first wavelength through the transfer layer and the chiplet to heat the bonding feature and thereby remove a bond between the chiplet and the target substrate or surface. While the bonding feature is heated, the transfer head is moved 1102 relative to the target substrate or surface to remove the chiplet from the target substrate or surface. This relative motion may be induced by moving one or both of the transfer head and the target substrate. The transfer layer is reusable for repeated transfer operations such as this.

Figure 12:
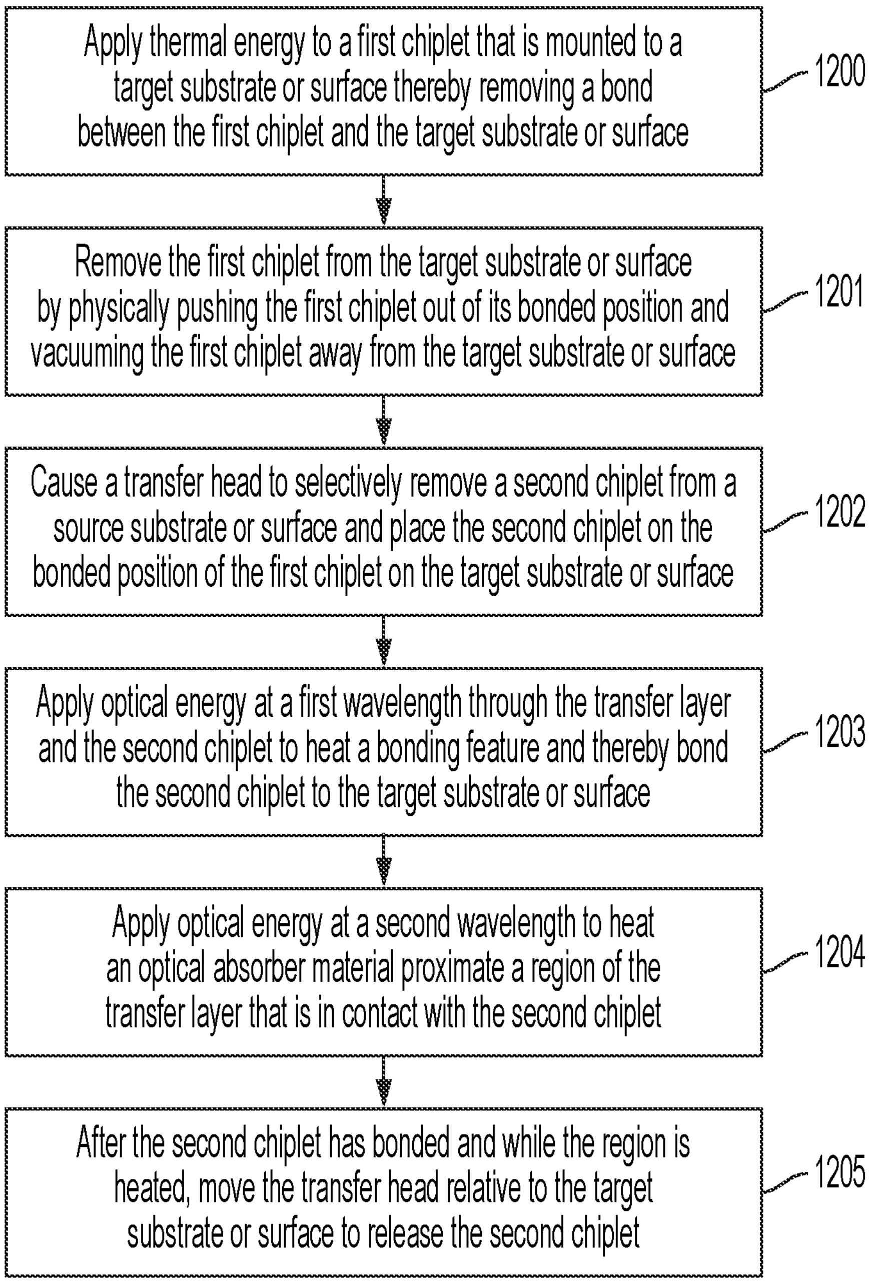

In FIG. 12, a flowchart shows a method of replacing a chiplet of a device according to an example embodiment. The method involves applying 1200 thermal energy to a first chiplet that is mounted to a target substrate or surface thereby removing a bond between the first chiplet and the target substrate or surface. The first chiplet is removed 1201 from the target substrate or surface by physically pushing the first chiplet out of its bonded position and vacuuming the first chiplet away from the target substrate or surface.

A transfer layer of a transfer head to selectively removes 1202 a second chiplet from a source substrate or surface and places the second chiplet on the bonded position of the first chiplet on the target substrate or surface such that a bonding feature is between the second chiplet and the target substrate or surface. First optical energy at a first wavelength is applied 1203 through the transfer layer and the second chiplet to heat the bonding feature and thereby bond the second chiplet to the target substrate or surface. Second optical energy at a second wavelength is applied 1204 to heat an optical absorber material proximate a region of the transfer layer that is in contact with the second chiplet. The transfer layer formed of a thermally switchable material such that the region exhibits a phase change in response to being heated. After the second chiplet has bonded and while the region is heated, the transfer head is moved 1205 relative to the target substrate or surface to release the second chiplet Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g., 1 to 5 includes 1, 1.5, 2, 2.75, 3, 3.80, 4, and 5) and any range within that range.

The various embodiments described above may be implemented using circuitry, firmware, and/or software modules that interact to provide particular results. One of skill in the arts can readily implement such described functionality, either at a modular level or as a whole, using knowledge generally known in the art. For example, the flowcharts and control diagrams illustrated herein may be used to create computer-readable instructions/code for execution by a processor. Such instructions may be stored on a non-transitory computer-readable medium and transferred to the processor for execution as is known in the art. The structures and procedures shown above are only a representative example of embodiments that can be used to provide the functions described hereinabove.

Terms related to orientation, such as "top," "bottom," "side," and "end," are used to describe relative positions of components and are not meant to limit the orientation of the embodiments contemplated. For example, an embodiment described as having a "top" and "bottom" also encompasses embodiments thereof rotated in various directions unless the content clearly dictates otherwise. Generally such terms are used herein to describe an orientation shown in the figure, and unless otherwise specified, are not meant to limit orientation of physical embodiments, e.g., relative to the Earth's surface.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination and are not meant to be limiting, but purely illustrative. It is intended that the scope of the invention be limited not with this detailed description, but rather determined by the claims appended hereto.

The invention claimed is:

1. A transfer system, comprising:

first and second optical energy sources operable to provide a respective first optical energy and second optical energy at a respective first wavelength and a second wavelength;

a chiplet having a bonding feature configured to interface with a corresponding bonding feature of a target substrate, at least one of the bonding feature and the corresponding bonding feature absorbing at the first wavelength such that applying the first optical energy bonds the chiplet to the target substrate or removes a bond between the chiplet and the target substrate;

a transfer layer formed of a thermally switchable material that undergoes a phase change when heated, the transfer layer being placed in contact with the chiplet during a transfer operation; and an optical absorber material on at least one of the transfer layer and the chiplet, the optical absorber material absorbing at the second wavelength such that applying the second optical energy heats a region of the transfer layer that corresponds to a location of the chiplet causing the region to adhere to the chiplet when removing the chiplet from a source substrate during the transfer operation, the transfer layer being reusable for repeated transfer operations.

2. The transfer system of claim 1, wherein the optical material comprises an optical absorber layer on a side of the transfer layer facing away from the chiplet, the optical absorber layer blocking transmission at the second wavelength and being transparent at the first wavelength.

3. The transfer system of claim 2, where the optical absorber layer comprises a semiconductor that is absorptive of the second optical energy at the second wavelength above a bandgap energy of the semiconductor, the semiconductor being transparent to the first optical energy at the first wavelength below the bandgap energy.

4. The transfer system of claim 1, wherein the optical absorber material blocks transmission at the second wavelength and is transparent at the first wavelength.

5. The transfer system of claim 1, wherein constituents of the optical absorber material are mixed into the transfer layer.

6. The transfer system of claim 1, wherein the bonding of the chiplet to the target substrate or surface comprises welding or soldering electrical connections therebetween.

7. The transfer system of claim 1, the first and second optical energy sources comprise first and second scanned laser beams that provide overlapping coverage of the transfer layer.

8. The transfer system of claim 1, wherein the first wavelength is longer than the second wavelength.

9. The transfer system of claim 1, wherein the transfer layer is thermally cycled above and below a glass transition temperature after the transfer operation to smooth out surface features formed on transfer layer by the chiplet.

* * * * *